United States Patent [19]

Doré et al.

[11] 4,074,258

[45] Feb. 14, 1978

[54] DEVICE FOR READING DISPLACEMENTS OF A MOVABLE MEMBER

[75] Inventors: Alain Doré, Conflans Sainte-Honorine; Jean Picard, Versailles; Jacques Rochereau, Montmagny, all of France

[73] Assignee: Societe d'Applications Generales d'Electricite et de Mecanique (SAGEM), France

[21] Appl. No.: 682,347

[22] Filed: May 3, 1976

[30] Foreign Application Priority Data

May 7, 1975    France .............................. 75 14339

[51] Int. Cl.² .......................................... H03K 13/18
[52] U.S. Cl. ........................ 340/347 P; 340/347 M; 250/231 SE; 235/454; 235/92 MP
[58] Field of Search ........ 340/347 P, 347 M, 146.3 Z; 235/61.11 E, 61.11 D, 92 MP; 250/231 SE

[56] References Cited

U.S. PATENT DOCUMENTS

| | | | |
|---|---|---|---|
| 3,648,276 | 3/1972 | Schuman | 340/347 P |
| 3,794,812 | 2/1974 | Bryant | 235/61.11 E |
| 3,913,095 | 10/1975 | Dlugos | 340/347 P |

*Primary Examiner*—Thomas J. Sloyan
*Attorney, Agent, or Firm*—Larson, Taylor and Hinds

[57]    ABSTRACT

A device for reading out the position of a movable member comprising a scale carried by that member and having equidistant coded references. Each reference is different from the others. A stationary optical system forms the image of a portion of the scale on a fixed detector. The detector comprises a linear matrix of photo detectors regularly distributed at predetermined intervals and associated with electronic means which identifies the coded reference whose image is formed on the matrix and reads out the serial number of the photo element on which the leading edge of the coded reference is formed.

9 Claims, 6 Drawing Figures

DEVICE FOR READING DISPLACEMENTS OF A MOVABLE MEMBER

BACKGROUND AND SUMMARY OF THE INVENTION

The invention is concerned with devices for reading of position of a movable member, and more particularly devices wherein a digital read out of the position of a scale carried by the movable member is produced.

There are known numerous devices wherein displacement of a scale which is carried by the member and is constituted by references which are distributed at equal intervals, is read by a fixed detector, in which an optical system (this term designating not only radiation visible by the eye but also UV and IR) forms the image of a portion of the scale which occupies a predetermined position relatively to the detector onto the latter. Simple devices of this kind are generally incremental, that is to say do not directly determine the position of the scale but rather its displacement from a datum position. There also exist prior art devices which make an absolute determination (French patent specification No. 2241058). They generally use a detector which comprises a first system for approximation and a second system for carrying out the interpolation required to achieve a high degree of precision between a reference and the next successive (or next preceding) reference.

It is an object of the invention to provide an improved device for reading the position of a movable member (and thus, if required, to measure the displacement of this member in a predetermined direction). It is a more particular object of the invention to provide a device which is absolute (and thus does not at any moment require a re-checking with respect to an origin or datum position and is not subject to cumulative errors), and thus affords a large measuring range and a high degree of precision whilst remaining simple and permitting and enabling a high frequency of measurement.

According to an aspect of the invention, there is provided a device for reading of the position of a member movable with respect to another, comprising a scale carried by a first one of the members and having coded references distributed at equal intervals along the direction of relative movement of said members, each said reference being distinct from the other and identifying the serial number of the reference on said scale, and an optical system which forms, on a detector carried by the other member, an image of a portion of the scale which is situated at a predetermined location with respect to said other member and is of a length at least equal to said interval plus the maximum length of a reference in said direction, wherein the detector device comprises a linear matrix of photodetectors which are regularly distributed along said direction, and are operatively associated with electronic means constructed for identifying that coded reference whose complete image is formed on the matrix and for reading out the serial number of the photo element on which the image of a predetermined position in said coded reference is formed.

In this arrangement, there is no necessity for two different detector systems, and two different sets of references, one for identifying the reference of which the image is formed on the detector, and the other for interpolating between two successive references.

The matrix of photodetectors may in particular be constituted by a strip of photo diodes or photo transistors which is part of an integrated circuit constituting the electronic system. The code used is advantageously binary so that two levels are sufficient of illumination of the photo detectors.

The accuracy of measurement is conditioned by the accuracy of the engraving of the scale and the magnification of the optical system: this accuracy can be very high since, with a matrix of detector photo elements at a spacing of 25 $\mu$m it is possible to achieve a precision of 1 $\mu$m with an enlargement ratio of 25/1.

SHORT DESCRIPTION OF THE DRAWINGS

The invention will be better understood by reference to the following description of a device which represents a particular non-limitative embodiment. The description refers to the accompanying drawings, in which:

FIG. 1 diagrammatically shows the relative disposition of the principal constituent parts of the device, FIG. 2 shows diagrammatically the successive references of a device which has a maximum of eight references identified by a number with three binary digits, FIG. 3 is a detail view of the image of one of the references formed on the photodetector matrix by the optical system, FIG. 4 is a simplified diagram showing an electronic identification system which can be used in the device of FIGS. 1 to 3, FIG. 5 is a block diagram of a network of gates incorporated in the diagram of FIG. 4, FIG. 6 is a diagram used in explanation of the operation of the invention showing the variation in time of the signals which appear at different points of the diagram of FIG. 4.

DETAILED DESCRIPTION OF PREFERRED EMBODIMENTS

Figure 1:
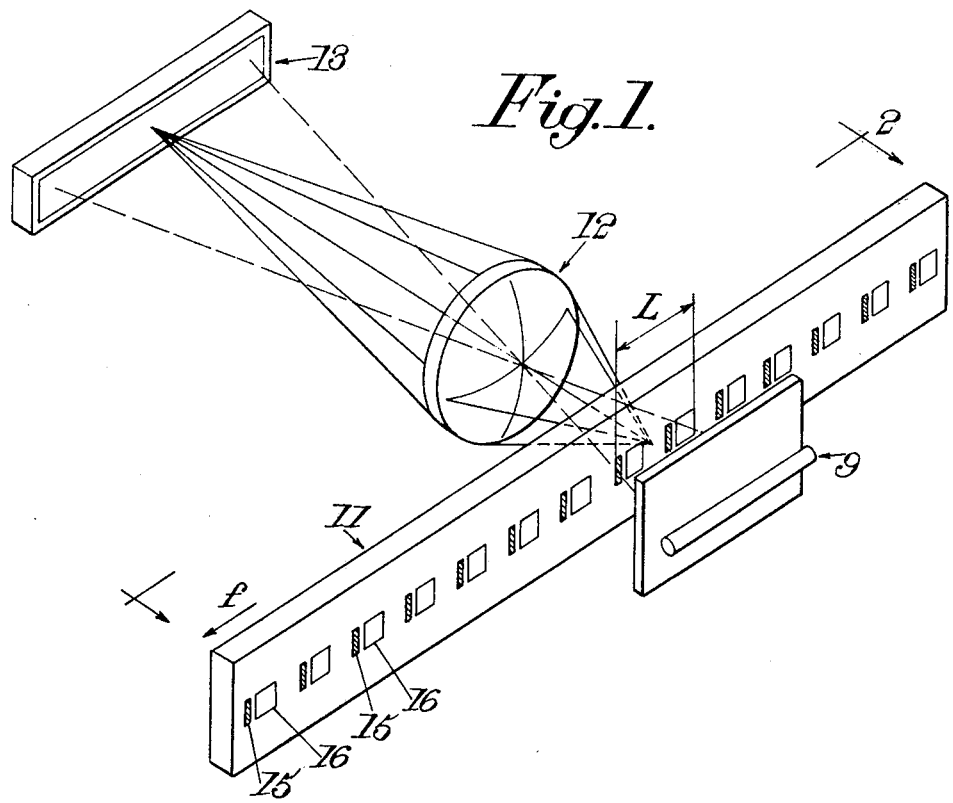

Referring to FIG. 1, there are shown the main elements of the device for determining the position of a member which is rectilinearly movable in direction $f$, in diagrammatic form. The device may be regarded as comprising a graduated scale 11 which is connected to the member, a fixed detector 13 and a fixed optical system 12 for forming the image of that fraction of the scale which is in a predetermined zone with respect to the detector 13 on said detector. The scale 11 carries successive coded references which are distributed at equal intervals in relation to direction $f$ and is lighted by an illuminating apparatus 9. Each of the references is typically constituted by a particular pattern of marks which are opaque on a transparent background or light transmitting on an opaque background for the image formed by the optical system 12 on the detector device to appear as a succession of areas of differing degrees of illumination superimposed on photoelements 17. Alternatively, a reflective rather than a transmitting scale may be used with a modified optical system.

Each of the coded references $14_0, 14_1, \ldots, 14_n$ carried by the graduated scale 11 (or its image on the detector 13) can be regarded as consisting of:

a mark 15 for interpolation purpose, the marks 15 of all references being identical and being distributed at equal intervals along the scale, a group of reference identifying marks 16, consisting of a pattern specific to that reference and which can be regarded as representing a number (typically a binary number) assigned to the reference.

Figure 2:
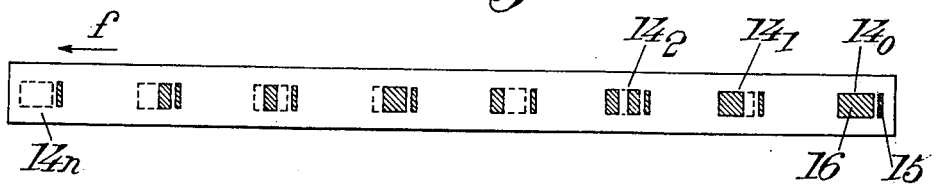
Figure 3:
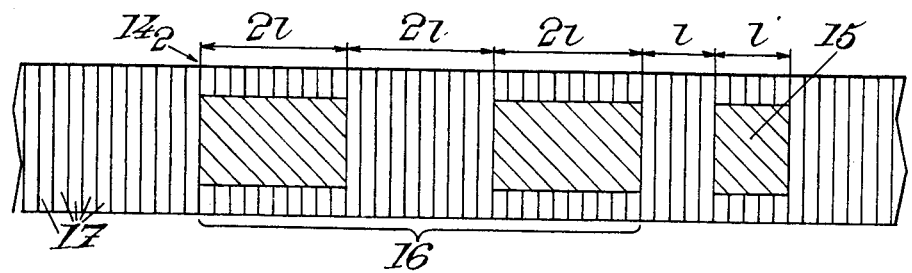

In the embodiment of FIGS. 2 and 3 (the latter illustrating the image of reference $14_2$) the interpolation mark 15 is a transparent zone of length $l$ while the identification marks 16 are constituted by a pattern of three successive areas having each a length $2l$, each corresponding to one bit of a three-bit number. A transparent area corresponds to a binary zero and an opaque area corresponds to a binary one. The first area of length $2l$ starts at a distance $l$ from the end of mark 15 and it corresponds for example to the most significant bit or MSB of the binary number identifying the reference.

The arrangement may as well be reversed, with the successive references from the left of FIG. 2 corresponding to binary numbers 0, 1, 10, 11, 100, 101, 110 and 111. Then the area corresponding to the LSB is closest to the interpolation mark 15 in each reference. Such reversal should of course be reflected in the design of the decoding electronic circuitry.

The references $14_0, 14_1, \ldots, 14_n$ may consist of still different patterns. For instance the interpolation mark of the reference may be the leading (or trailing) edge of a square area having a light intensity which is different from that of all other areas in a reference.

It appears from simple calculation that it is possible in every case to achieve a large measuring range with a high precision while using a moderate number of detector photo elements; if the following notation is used:

$m$: number of photo elements corresponding to the spacing of the references ("pitch" of the references), $n$: total number of photo elements, $k$: number of photo elements necessary to define a digit of information (of length $2l$), $b$: number of levels of light intensity (which is 2 in the present embodiment, which uses binary numeration), then the measuring range, expressed as the number $d$ of different measurable positions, is:

$$d = (m)(2)\left(\frac{n-m}{k}\right)$$

If $n = 256$, $k = 3$ and $m = 127$, then $d \simeq 10^{15}$, with a frequency of measurement whch may be as high as 5 kHz with electronic components which are presently available; with $n = 384$, $k = 10$ and $m = 255$, a figure of $d \simeq 2 \times 10^6$ may be achieved.

The detector on which the image is formed is a linear matrix of $n$ photo elements 17, distributed parallel to the direction of the image of the graduated scale.

The magnification by the optical system should be such that each transparent area of length $l$ covers several photo elements. In the illustrated embodiment the degree of magnification is such that the length $l$ corresponds to five photo elements 17. The latter may be photo diodes of a strip forming part of an integrated circuit; the optical system 12 forms on the matrix the image of a zone of the scale 11 of such a length that at least one complete coded reference 14 is always reproduced. For that purpose the optical system 12 forms the image of a zone of length L (FIG. 1) at least equal to the distance between the beginning of a coded reference and the end of the next following coded reference. The detector comprises photo-sensitive elements whose number is sufficient to take the overall image. It can of course be longer, but the photo elements beyond the image are then useless.

The linear matrix of photo elements 17 is associated with an electronic circuit which is designed to fulfil several functions:

to recognize the interpolation mark 15 of that coded reference 14 whose image is wholly projected on the matrix of photoelements 17 (that mark being on one side of the reference in the illustrated embodiment);

to read out the serial number $x$ of that photo element 17 corresponding to a characteristic feature in the interpolation mark 15, for instance the leading edge;

to identify the reference 4, that is to decode the binary number $y$ which is assigned to it;

and to compute, from $x$ and $y$, the number $z$ representing the position of the movable member, that is to say $z = x + my$ if the references are successively numbered $0, 1, \ldots y$.

Figure 4:
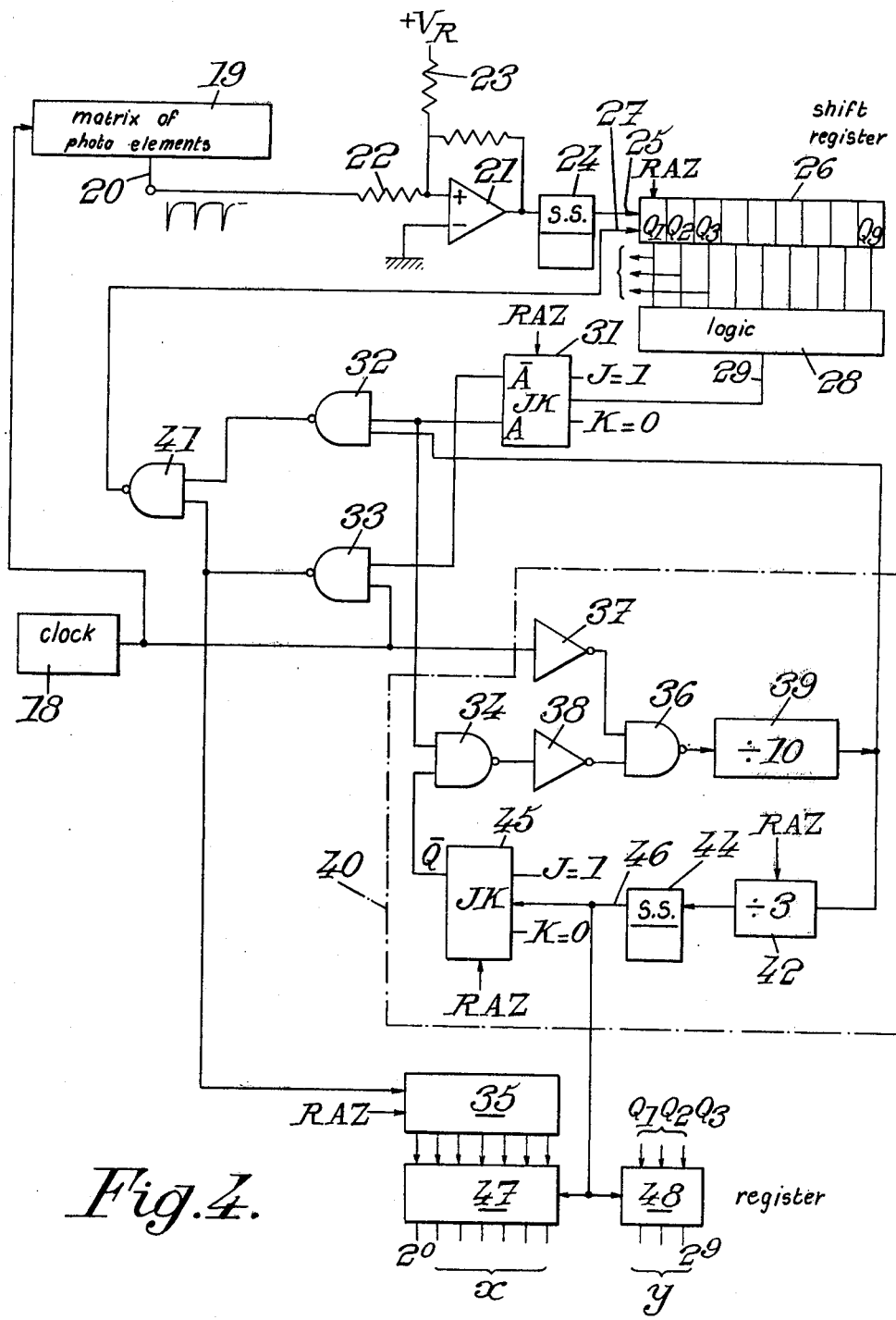
Figure 5:
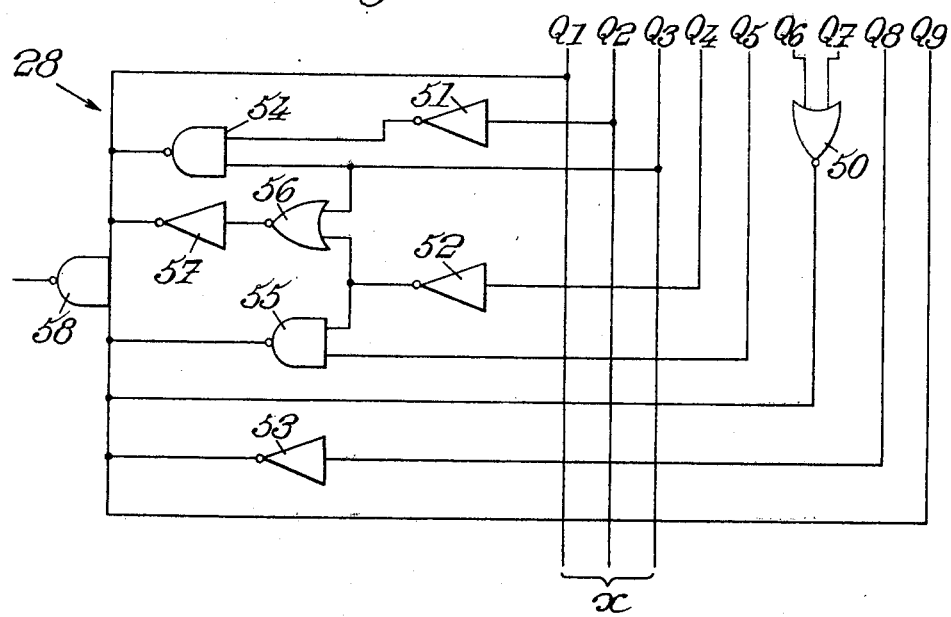

These functions may be fulfilled using the electronic circuitry diagrammatically illustrated in FIGS. 4 and 5, which is designed for cooperation with a matrix of photo elements 17 in which $l$ corresponds to the distance covered by five successive photo elements 17. The circuitry is for sequential reading of the photo elements 17 at a frequency determined by a clock 18 included in the electronic system. This system successively identifies the beginning of a complete coded reference, and in response thereto stops the counting of $x$, and then identifies the reference that it reads out as $y$. All electric blocks may be conventional TTC integrated circuits soldered on printed circuits for connection purposes.

Figure 6:
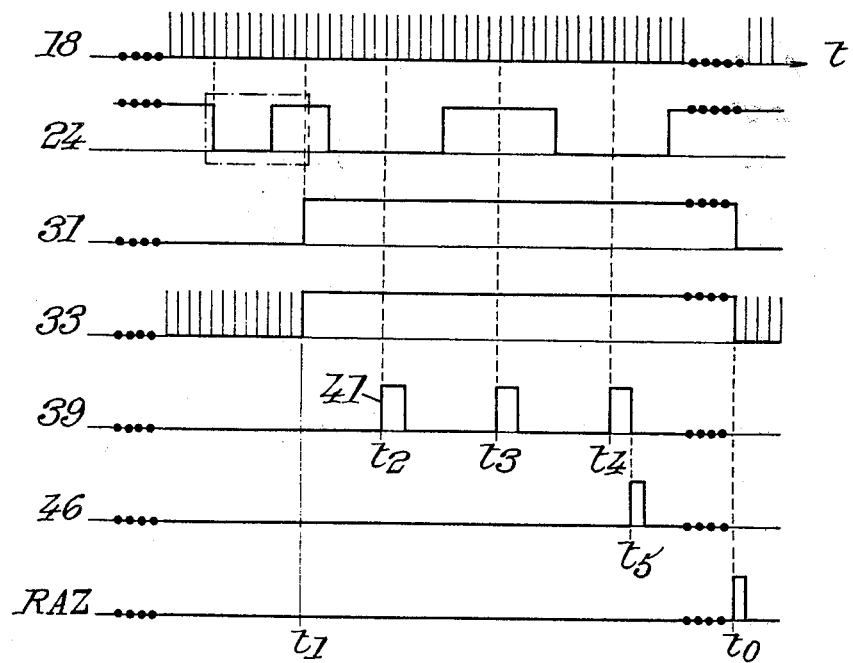

Referring to FIG. 4, clock 18 has an output frequency which is selected to be compatible with the response time of the photo elements 17. A clock frequency of 1 MC/sec can be used if the matrix is a strip of photo diodes sold under reference RL 256 C by Reticon, which includes $2^8$ photo diodes at a spacing of 25 microns. The output signals of clock 18 are applied to a scanning input of the block 19 including the strip of photodiodes (line 18 on FIG. 6). The circuit referred to, i.e., the RL 256C circuit, is constructed so that the successive signals from clock 18 are translated into sampling signals which are supplied to the successive photodiodes in sequence. In response to the sampling signals, each photoelement, if illuminated at that time by optical system 12, delivers a negative pulse on the single output 20 of block 19.

The electronic circuitry of FIG. 4 comprises a pulse shaper comprising an amplitude comparator 21 and a single shot multivibrator or univibrator 24.

One of the inputs of the comparator 21 is grounded. The second input receives the successive pulses from the output 20, through a resistor 22. The second input is also biased by a positive reference voltage $+ V_R$, lower than the amplitude of the negative pulses delivered by output 20 of the matrix block 19, through a resistor 23. Each time the comparator 21 receives a sufficient voltage pulse from the matrix, the output thereof delivers a signal which sets the univibrator 24. As a consequence, in response to the sampling of a photo element 19 illuminated by a transparent mark the univibrator delivers a square wave voltage signal, the time duration of which is selected at a value slightly higher than the clock period. Thus the scanning of the beginning of the coded reference $14_2$ for example results in the appearance at the output of the univibrator 24 of the square signal which is illustrated at line 24 of FIG. 6.

The circuit as illustrated is for a scale on which transparent identification marks are to be decoded as binary "ones". On the other hand, the same circuit may be used if opaque marks are to be considered as binary "ones" if an inverter is located in series with the output of the pulse shaper.

The shaped signals are applied to the serial input 25 of a shift register 26 having 9 binary positions (this number being selected to correspond to the number of photo elements which are necessary to identify the presence of the interpolation mark 15 of a reference). The register 26 comprises a "clear" input designated by RAZ, a forward shift control input 27 and nine parallel outputs $Q_1$ to $Q_9$. The outputs $Q_1$ to $Q_9$ are associated with a combination logic circuit 28 adapted for recognition of the configuration representing the illumination pattern typical of a mark 15 located at the beginning of a reference in the illustrated embodiment. It will be assumed, for the sake of clarity, that logic circuit 28 is provided for recognising the configuration consisting of one non-illuminated photo element, then five successive illuminated photo elements, and then three non-illuminated photo elements (corresponding to the form of the signal in a dash-dot frame in FIG. 6). When the combination logic circuit recognises this configuration, its output 29 switches from logic level 1 (for instance high level) to logic level 0 (for instance low level).

The output 29 is connected to the clock input 30 of a JK flip-flop 31, the inputs J and K of which are respectively biased at voltage levels representing 1 and 0. Flip-flop 31 thus changes state at time $t_1$ in response to the recognition of the interpolation mark 15 indicating the beginning of a coded reference (line 31 in FIG. 6). Output A of flip-flop 31 is connected to respective inputs of an $\overline{AND}$-gate 32 (currently designated NAND-gate) and a NAND-gate 34. Thus the swing from logic level 0 to logic level 1 at output $\overline{A}$ enables gates 32 and 34. The swing from 1 to 0 at output $\overline{A}$ disables the NAND-gate 33. The pulses from clock 18 (which until then had reached, through NAND-gate 33, the register 26 and a 7-bit digital counter 35) are blocked and the counter 35 then stores the value of $x$ in binary form (line 33 of FIG. 6).

The block for identification of the number $y$ of the reference, which is indicated by the frame 40 in FIG. 4, is provided for sampling the output of the univibrator 24 at times $t_2$, $t_3$ and $t_4$ (FIG. 6), that is to say to determine the state of illumination of the photo elements situated at the middle of the images of the three marks of the group 16. Block 40 comprises a NAND-gate 36 whose inputs receive:

through an inverter 38, the output of NAND gate 34 (reset in response to the passage from 0 to 1 of the output A of flip-flop 31).

through an inverter 36, the pulses from clock 18.

NAND-gate 34 being disabled and NAND-gate 36 consequently being enabled, the inverted clock pulses, applied to the second input of NAND-gate 36, are transmitted to a divider by ten 39. The divider 39 delivers at its output a square signal for each tenth clock pulse (line 39 of FIG. 6). The output of the divider 39 is connected to the second input of NAND-gate 32. The output signals of the divider 39 are transmitted through gate 32 and through a NAND gate 41 to the shift input of the register 26. The first of these signals commands loading into the first stage of the register (having output $Q_1$) of a bit representative of the state of the output of the univibrator, and hence the state of illumination of the photo element which is being sampled by the clock at instant $t_2$. It is seen that the first identification mark of the group 16 is thereby sampled. The following two output signals from the divider 39 each imposes a one-stage shift and a sampling operation. Finally samples of the three identification marks of group 16 are available at the outputs $Q_3$, $Q_2$ and $Q_1$ of register 26.

Obviously a divide by ten divider 39 is used only because each identification mark of group 16 has a length size $2l$ corresponding to ten photo elements 17 and a space $l$ is reserved between each mark 15 and the beginning of the group 16 of the same reference. A different divider would be used if the size $2l$ were to correspond to a different number of photo elements 17.

The output of divider 39 is also connected to the input of a divide by three divider 42 (that is to say by the number of marks in each group 16). The output of the divider 42 in turn is applied to a pulse-shaping circuit constituted by a single-shot multivibrator or univibrator 44. The output signal from the univibrator 44 is applied:

to the clock input of a JK flip-flop 45 the inputs J and K of which are respectively biased at logic levels 1 and 0, to the control inputs of two buffer registers 47 and 48 whose functions are to receive and store the numbers $x$ and $y$.

Output $\overline{Q}$ of JK flip-flop 45 is connected to the second input of NAND-gate 34. When output $\overline{Q}$ passes from 1 to 0 on receiving the signal from the univibrator 44, it disables or inhibits NAND-gate 36. Thus no further clock pulse will arrive at the divider 39.

The signal appearing at the output 46 of univibrator 44 at instant $t_5$ which corresponds to the end of the signal furnished by the divider 39 (line 46 in FIG. 6) is applied to the control inputs of the buffer registers 47 and 48 provided for parallel loading of all their stages. The inputs of the seven binary positions of the register 47 are connected to the outputs of counter 35. The three inputs of register 48 are connected to the outputs $Q_1$, $Q_2$ and $Q_3$ of shift register 26. Thus at instant $t_5$ one of the registers 47 and 48 receives $x$ and the other $y$. When use is made of a matrix of 256 diodes and of a 3-bit reference identifying group (the bit closest to the initial mark of the code being the MSB), it may be considered that the ten outputs of the registers 47 and 48 will directly indicate the position of the movable member, in the form of a 10-bit number.

The operation of the device which has been described will only be briefly set out, assuming that it is the reference $14_2$ whose image is wholly formed on the matrix, at the same time as a fraction of the reference $14_1$.

Each measuring cycle is triggered by a signal from a generator (not shown) consisting of a divider fed by clock 18 and furnishing trigger signals at intervals of time longer than the duration of scanning of the matrix 19. The trigger signal is applied to the "clear" inputs RAZ of the shift register 26 and counter 35 and register 48, resets the flip-flops 31 and 45 and initiates the scanning of matrix 19, starting from the first photo element.

Binary numbers representative of the states of the photo elements are thus circulated in sequence through shift register 26. If it is assumed that the image of the final part of the reference $14_1$ is formed on the matrix, at a given moment there will be binary ones in the register 26 but with a distribution which cannot be that illustrated at line 24 on FIG. 6. The leading portion of the reference $14_2$ next appears in register 26. At time $t_1$ the outputs $Q_1$ to $Q_9$ are in a state reproducing the configuration defined above (a first photo element not lighted, five lighted photo elements, three non-lighted photo elements) and an electric signal representing the leading portion of the code appears at the output 29 and changes the state of flip-flop 31. No more clock pulses will arrive at register 26, which will remain in the same condition until time $t_2$, when the first output signal from the divider 10 causes a signal representing the first reference identification mark (MSB mark) of group 16 of the coded reference 14₂ to pass into the first stage of register 26. Instant $t_2$ will occur at seven clock pulses after $t_1$, since the divider 39 receives a first pulse as soon as the condition of JK flip-flop 31 changes. Moreover, divider 39 is used to send an output signal as soon as its 9th flip-flop passes from 0 to 1 and to maintain this signal until the cycle has been completed; consequently the cycle may be schematized as follows:

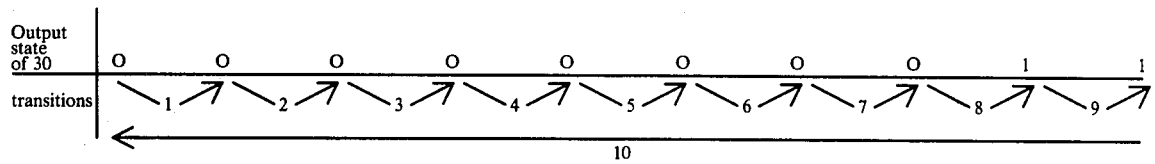

At time $t_3$, the pulse sent by the divider 39 shifts register 26 and at the same time loads a figure representing the second mark of group 16 into the first stage. Last at instant $t_4$ another shift takes place and a third figure is loaded. Then at the trailing edge of the output signal of the univibrator 44, (at instant $t_5$,) the results of the readout is transferred into the registers 47 and 48. Finally at the instant $t_0$, a fresh trigger signal is emitted and the cycle is repeated.

It has hitherto been assumed that the combination logic circuit 28 has only been provided to recognise the following configuration of the contents of the shift register 26:

| $Q_1$ | $Q_2$ | $Q_3$ | $Q_4$ | $Q_5$ | $Q_6$ | $Q_7$ | $Q_8$ | $Q_9$ |
|---|---|---|---|---|---|---|---|---|
| 1 | 1 | 1 | 0 | 0 | 0 | 0 | 0 | 1 |

In fact this configuration is only one of those which can be produced when an interpolation mark 15 of a reference is present. In practice the size of this mark may not correspond exactly to five photo elements 17, having regard to manufacturing tolerances. The image of a mark 15 is not necessarily exactly centered onto five photo elements as is shown in FIG. 3. For all these reasons the size of the starting mark of the code cannot be defined better than with an approximation of ± two photo elements. In other words the combination logic circuit 28 has to deliver an identification signal for any one of the following configurations:

| $Q_1$ | $Q_2$ | $Q_3$ | $Q_4$ | $Q_5$ | $Q_6$ | $Q_7$ | $Q_8$ | $Q_9$ |
|---|---|---|---|---|---|---|---|---|
| 1 | 1 | 1 | 1 | 1 | 0 | 0 | 0 | 1 |
| 1 | 1 | 1 | 1 | 0 | 0 | 0 | 0 | 1 |
| 1 | 1 | 1 | 0 | 0 | 0 | 0 | 0 | 1 |
| 1 | 1 | 0 | 0 | 0 | 0 | 0 | 0 | 1 |
| 1 | 0 | 0 | 0 | 0 | 0 | 0 | 0 | 1 |

This means that the following logic equation has to be fulfilled:

(1)

$$S = Q_1 Q_9 \overline{Q_6} \overline{Q_7} \overline{Q_8} (Q_2 Q_3 Q_4 Q_5 \vee Q_2 Q_3 Q_4 \overline{Q_5} \vee Q_2 Q_3 \overline{Q_4} \overline{Q_5} \vee Q_2 \overline{Q_3} \overline{Q_4} \overline{Q_5} \vee \overline{Q_2} \overline{Q_3} \overline{Q_4} \overline{Q_5})$$

(S being the output signal from the combination logic circuit 28).

The Karnaugh corresponding to this expression, can be simplified and rendered as:

$$s = Q_1 Q_9 \overline{Q_8} \overline{(Q_6 \vee Q_7)} \overline{(Q_5 \cdot \overline{Q_4})} \overline{(\overline{Q_4} \vee Q_3)} \overline{(\overline{Q_2} \cdot Q_3)} \quad (2)$$

The logic equation (2) may in particular be obtained by the combination logic circuit 28 of FIG. 5 comprising a NOR-gate 50 fed by the outputs $Q_6$ and $Q_7$ of shift register 26, inverters 51, 52 and 53 (which could be constituted by NAND-gates) interposed on the outputs $Q_2$, $Q_4$ and $Q_8$, as well as NAND-gates 54 and 55, a NOR-gate 56 and an inverting gate 57. The outputs of gates 54, 57, 55, 50 and 53 and the output $Q_9$ are applied to the inputs of an output NAND-gate 58.

The invention is not limited to the particular embodiment which has been illustrated and described by way of example.

The invention moreover is of use in numerous technical fields, with the movable member being for example rotary or axially movable. In particular it is possible to achieve an angular encoder of great precision. One might for example provide a device having an accuracy of 5 seconds of angular movement, the member and the detector having a volume not exceeding 80 to 90 mm of diameter, the number of references and the number of photo elements between two references providing for a distribution in $2^{12}$ points. One can also use the device as an encoder for determining the linear position of a member, for example in control machines or machine tools.

We claim:

1. A device for reading the position of a member movable with respect to another, comprising a scale carried by a first one of the members and having coded references distributed at equal intervals along the direction of relative movement of said members, each said coded reference being distinct from all the others and identifying the serial number of the coded reference on said scale, and an optical system which forms, on a detector carried by the other member, an image of a portion of the scale which is situated at a predetermined location with respect to said other member, said portion having a length at least equal to one of said intervals plus the maximum length of one said coded reference in said direction, said detector comprising a linear matrix of photoelements which are regularly distributed along said direction and electronic means, operatively associated with said photoelements, for decoding that coded reference whose complete image is formed on the matrix as the most significant bits of a number indicating said position and for counting the number of the photoelements from one end of the matrix up to the photoelement on which the image of a predetermined location in said coded reference is formed so as to provide the least significant bits of the number indicating said position.

2. A device according to claim 1, in which said electronic means includes decoding means for identifying the serial number of the photo element on which the image of the leading end of said coded reference is formed.

3. A device according to claim 2, wherein each coded reference is constituted by an initial mark having a predetermined first length along said direction and spaced by a predetermined distance from a group of reference identification marks each having a predetermined second length and being representative of a number identifying the reference, the initial mark of the code and said distance being of a length different from that of the marks of the group.

4. A device according to claim 3, wherein the reference identification marks of the group comprise zones of the same length, the image of which on the detector has one of two different levels of illumination, each reference identification mark corresponding to a bit of different significance.

5. A device according to claim 4, wherein said electronic means comprises, in combination: clock means for sampling all said photo elements in sequence, each particular one of the photo elements which is sampled delivering, on an output, a logic signal having either one of two levels depending on the degree of illumination of the photo element; a shift register connected to receive sequentially the successive signals appearing at said output of the matrix of photo elements; a logic circuit for identification of the particular configuration at parallel outputs of the shift register which corresponds to the leading portion of a coded reference and providing a signal in response thereto; means responsive to said signal for stopping incrementation of an interpolating counter by the pulses from said clock means and enabling a circuit for decoding and reading the group of marks representing the identifying number of coded reference.

6. A device accoring to claim 5, wherein the reading circuit comprises a divider which receives the pulses from the clock means and delivers, at intervals corresponding to the size of one reference identification mark of the group, a pulse enabling recording of a binary signal corresponding to the state of a photo element which receives the image of the particular reference identification mark.

7. A device according to claim 6, wherein the divider commands loading of a bit representing the reference identification mark into the first stage of the shift register.

8. A device according to claim 7, further comprising means for transferring, after complete identification of the coded reference, the contents of the first stages of the shift register, constituting the bits representing the marks, to displaying means.

9. A device for reading the position of a movable member with respect to a fixed detector along a predetermined direction, comprising:

a scale carried by said member and including a plurality of coded references each comprising an interpolation mark and a binary coded identification mark, the interpolation marks being identical in all references and being distributed at equal intervals along said direction while said identification marks provide a representation of the serial number of the respective references along said direction, a stationary optical system for forming an image of a portion of said scale on said detector, said detector comprising a linear matrix of adjacent photo sensitive elements regularly distributed so that a plurality of photo sensitive elements corresponds to the image of each said mark formed by the optical system, electronic logic means, operatively associated with said photo-sensitive elements, for decoding the serial number of the coded reference whose image is formed on the matrix as the most significant bits of the number indicating said position and for counting the number of the photo sensitive elements from one end of said matrix of photo sensitive elements up to the photo sensitive element on which the image of a predetermined location in said coded reference is formed so as to provide the least significant bits of the number indicating said position.

* * * * *